United States Patent
Chang

(10) Patent No.: US 12,300,660 B2
(45) Date of Patent: May 13, 2025

(54) METHOD OF FORMING A BONDED SEMICONDUCTOR STRUCTURE

(71) Applicant: TAIWAN SEMICONDUCTOR MANUFACTURING COMPANY LTD., Hsinchu (TW)

(72) Inventor: Jen-Yuan Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 677 days.

(21) Appl. No.: 17/585,869

(22) Filed: Jan. 27, 2022

(65) Prior Publication Data
US 2023/0238353 A1    Jul. 27, 2023

(51) Int. Cl.
*H01L 23/00*    (2006.01)
*H01L 23/544*   (2006.01)

(52) U.S. Cl.
CPC .............. *H01L 24/80* (2013.01); *H01L 24/75* (2013.01); *H01L 24/83* (2013.01); *H01L 23/544* (2013.01); *H01L 24/05* (2013.01); *H01L 24/08* (2013.01); *H01L 24/29* (2013.01); *H01L 24/32* (2013.01); *H01L 2223/54426* (2013.01); *H01L 2224/05139* (2013.01); *H01L 2224/05144* (2013.01); *H01L 2224/05147* (2013.01); *H01L 2224/08145* (2013.01); *H01L 2224/29186* (2013.01); *H01L 2224/2919* (2013.01); *H01L 2224/32145* (2013.01); *H01L 2224/75702* (2013.01); *H01L 2224/75753* (2013.01); *H01L 2224/75824* (2013.01); *H01L 2224/8013* (2013.01); *H01L 2224/8313* (2013.01)

(58) Field of Classification Search
None
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |

(Continued)

FOREIGN PATENT DOCUMENTS

CN        102194717 A   *  9/2011   ........... H01L 21/561

*Primary Examiner* — Telly D Green
(74) *Attorney, Agent, or Firm* — WPAT LAW; Anthony King

(57) ABSTRACT

A method of manufacturing a bonded structure includes providing a first semiconductor structure including a first die, a first dielectric layer and a first conductive pad electrically connected to the first die and surrounded by the first dielectric layer; providing a second semiconductor structure including a second die, a second dielectric layer and a second conductive pad electrically connected to the second die and surrounded by the second dielectric layer; providing a carrying module including a holding unit configured to hold the second semiconductor structure and an anchoring unit movably attached to the holding unit, wherein the anchoring unit includes an end portion; disposing the carrying module and the second semiconductor structure over the first semiconductor structure; and displacing the anchoring unit towards the first semiconductor structure to make the end portion in contact with the first dielectric layer.

20 Claims, 18 Drawing Sheets

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2014/0311652 A1* | 10/2014 | Kostner ................. H01L 24/75 |
| | | 156/60 |
| 2019/0164806 A1* | 5/2019 | Leobandung ........... H01L 24/03 |
| 2020/0243479 A1* | 7/2020 | Arvin ...................... H01L 25/50 |
| 2021/0035933 A1* | 2/2021 | Lu ..................... H01L 23/49833 |
| 2021/0057309 A1* | 2/2021 | Hu ...................... H01L 23/5283 |
| 2022/0384412 A1* | 12/2022 | Horibe .................. H01L 23/538 |

\* cited by examiner

METHOD OF FORMING A BONDED SEMICONDUCTOR STRUCTURE

BACKGROUND

The semiconductor industry has experienced rapid growth due to ongoing improvements in the integration density of a variety of electrical components. To accommodate the miniaturized scale of the semiconductor device, various technologies and applications have been developed for the wafer-level packaging, involving greater numbers of different components with different functions. Improvement in integration density has resulted from iterative reduction of minimum feature size, which allows more components to be integrated into a given area.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
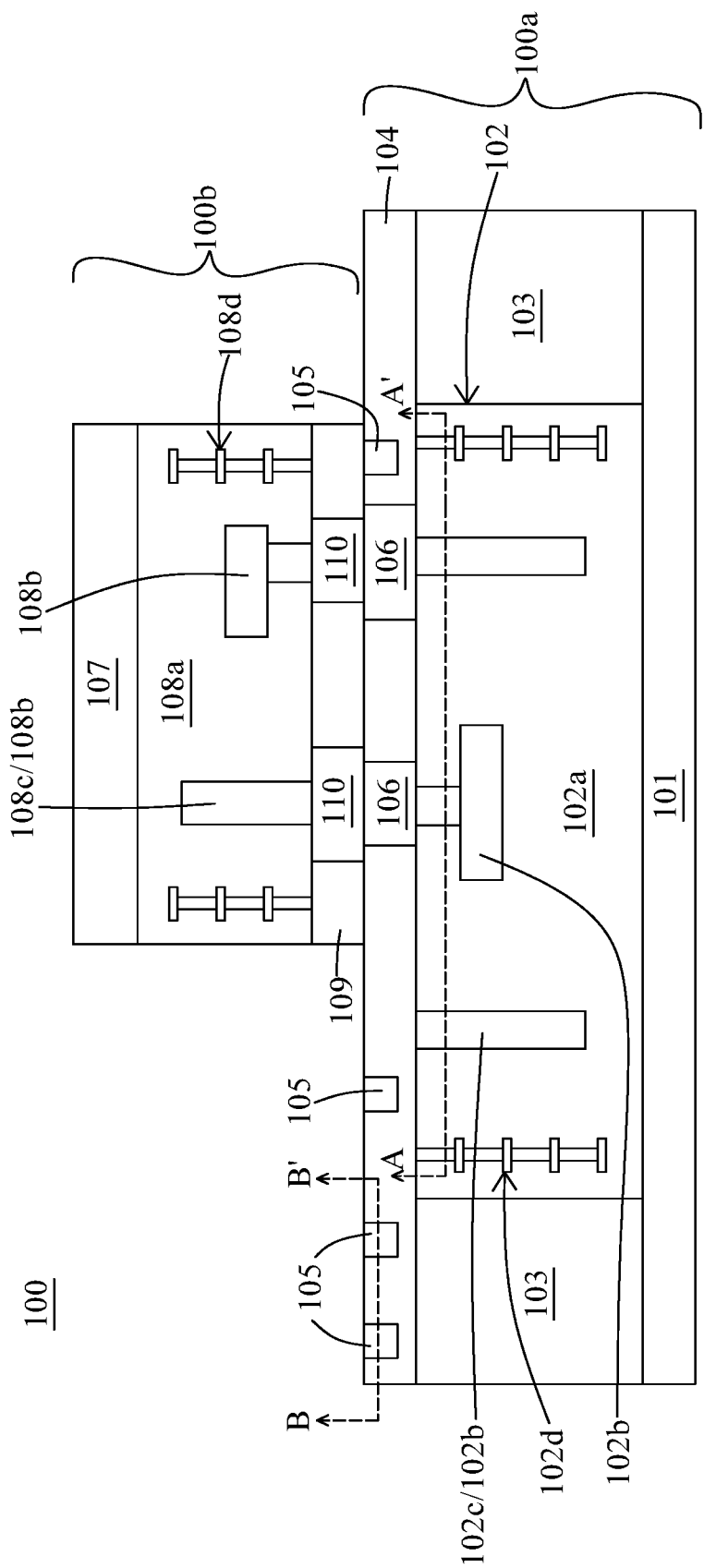
FIG. 1 is a cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a. value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In the present disclosure, a semiconductor structure and a method of manufacturing a semiconductor structure are provided. In some embodiments, a bonded structure and a method of forming the bonded structure are disclosed. The bonded structure includes a first semiconductor structure bonded with a second semiconductor structure. Other features and processes may also be included. In some embodiments, the method of forming the bonded structure includes using an anchoring unit to fix on a dielectric layer of the first semiconductor structure before placing the second semiconductor structure on the first semiconductor structure. As a result, a conductive pad of the second semiconductor structure can then be accurately aligned with and placed on a conductive pad of the first semiconductor structure. The second semiconductor structure can be well bonded with the first semiconductor structure.

FIG. 1 is a cross-sectional view of a bonded structure 100 in accordance with some embodiments of the present disclosure. In some embodiments, the bonded structure includes several semiconductor structures bonded with and stacked over each other. In some embodiments, the bonded structure 100 includes system on integrated circuit (SoIC) structure, chip on water on substrate (CoWoS) structure, integrated fan out (InFO) structure or the like.

In some embodiments, the bonded structure 100 includes a first semiconductor structure 100a and a second semiconductor structure 100b disposed over the first semiconductor structure 100a. In some embodiments, the first semiconductor structure 100a is a wafer, a package or the like. In some embodiments, the first semiconductor structure 100a is a fan out package or the like. In some embodiments, the first semiconductor structure 100a is electrically connected to the second semiconductor structure 100b. In some embodiments, the first semiconductor structure 100a includes a first substrate 101, a first die 102, a first molding 103 and a first dielectric layer 104, In some embodiments, the first substrate 101 includes semiconductive material such as silicon, germanium, gallium, arsenic, or a combination thereof. In some embodiments, the first substrate 101 is a semiconductor wafer. In some embodiments, the first substrate 101 is a silicon substrate. In some embodiments, the first die 102 is disposed over and supported by the first substrate 101. In some embodiments, the first die 102 includes active devices (not shown) such as transistors and/or diodes, and/or includes passive devices (not shown) such as capacitors, inductors, resistors, or the like. In some embodiments, the first die 102 is a logic die, a central processing unit (CPU) die, a micro control unit (MCU) die, an input-output (IO) die, an application processor (AP) die, or the like.

In some embodiments, the first die 102 includes a first dielectric 102a and a first interconnect structure 102b surrounded by the first dielectric 102a. In some embodiments, the first dielectric 102a includes several dielectric layers stacking over each other. In some embodiments, the first dielectric 102a includes dielectric material such as silicon oxide, silicon oxynitride, polyimide, silicon nitride or the like. In some embodiments, the first dielectric 102a is an inter-metal dielectric (IMD).

In some embodiments, the first interconnect structure 102b includes several. conductive members and several conductive vias surrounded by the first dielectric 102a. In some embodiments, the conductive member and the conductive via are electrically connected with each other within the first dielectric 102a. In some embodiments, the first interconnect structure 102b is electrical routing within the first die 102. In some embodiments, the first interconnect structure 102b includes a first conductive plug 102c extending within the first dielectric 102a and towards the first substrate 101. In some embodiments, the first conductive plug 102c is partially exposed from the first dielectric 102a, In some embodiments, the first interconnect structure 102b includes conductive material such as copper, silver, gold or the like.

Figures 2, 3:
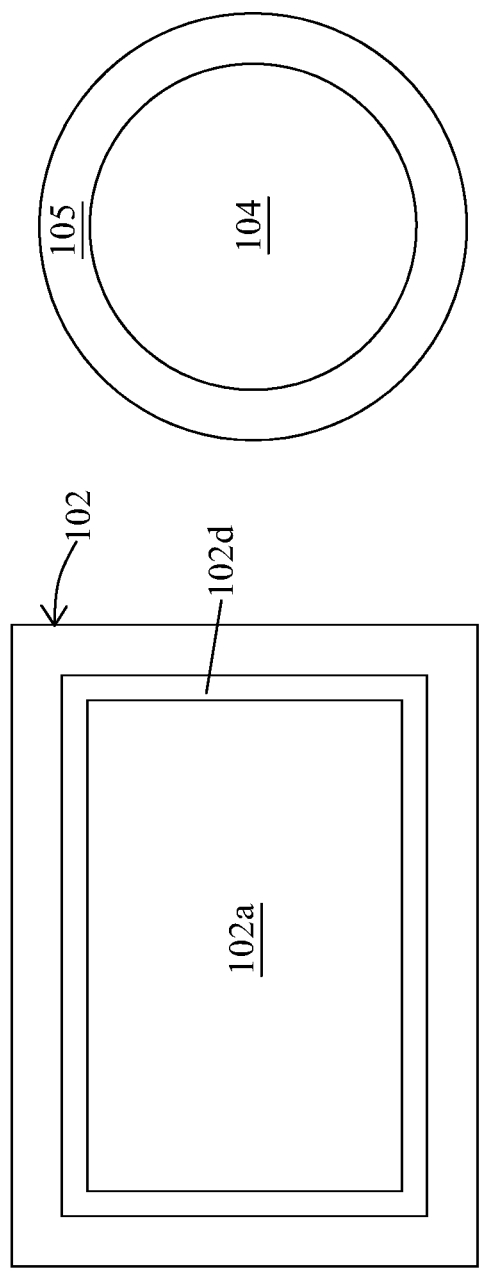
FIG. 2 is a top cross-sectional view of a seal ring structure in a semiconductor structure along a line AA' in FIG. 1.
FIGS. 3 to 7 are top cross-sectional views of various embodiments of an alignment pattern in a semiconductor structure along a line BB' in FIG. 1.

In some embodiments, the first die 102 includes a first seal ring structure 102d surrounded by the first dielectric 102a. In some embodiments, the first seal ring structure 102d extends towards the first substrate 101 and extends along a periphery of the first die 102. In some embodiments, the first seal ring structure 102d is configured to protect electrical components in the first die 102 from contamination or damage. In some embodiments, the first seal ring structure 102d is a dummy structure and is electrically isolated from the first interconnect structure 102b or other electrical components in the first die 102. In some embodiments, the first seal ring structure 102d is connected to an electrical ground. In some embodiments, the first seal ring structure 102d includes conductive material such as copper, silver, gold or the like. In some embodiments as shown in FIG. 2, the first seal ring structure 102d is in a strip configuration or a ring shape from a top cross-sectional view along a line AA' of FIG. 1.

Referring back to FIG. 1, in some embodiments, the first molding 103 is disposed over the first substrate 101 and surrounds the first die 102. In some embodiments, the first molding 103 surrounds and contacts the first dielectric 102a. In some embodiments, the first molding 103 includes molding compound, epoxy, polymer or the like. In some embodiments, the first molding 103 is configured to protect the first die 102.

In some embodiments, the first dielectric layer 104 is disposed over the first die 102 and the first molding 103. In some embodiments, the first dielectric layer 104 is disposed over the first dielectric 102a and the first interconnect structure 102b. In some embodiments, the first dielectric layer 104 includes dielectric material such as silicon oxide, silicon oxynitride, polyimide, silicon nitride or the like. In some embodiments, the first dielectric layer 104 and the first dielectric 102a include same or different dielectric material.

In some embodiments, the first semiconductor structure 100a includes an alignment pattern 105 surrounded by the first dielectric layer 104. In some embodiments, the alignment pattern 105 is partially exposed from the first dielectric layer 104. In some embodiments, the alignment pattern 105 is disposed over the first molding 103. In some embodiments, the alignment pattern 105 is disposed over the first dielectric 102a or the first die 102. In some embodiments, the alignment pattern 105 is disposed in the first substrate 101. In some embodiments, the alignment pattern 105 is disposed in the first substrate 101 and under the first die 102 or the first molding 103.

In some embodiments, the alignment pattern 105 includes dielectric material such as silicon oxide, silicon oxynitride, silicon carbide, polyimide, silicon nitride or the like. In some embodiments, the alignment pattern 105 includes conductive material such as metal. In some embodiments, the alignment pattern 105 includes conductive material such as copper, tungsten, gold, silver or the like. In some embodiments, the alignment pattern 105 includes silicon or the like.

Figure 5:
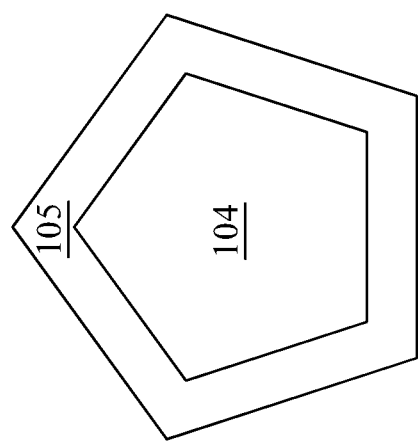
Figure 4:
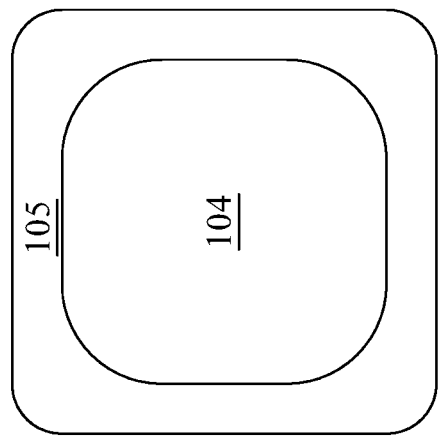
Figure 7:
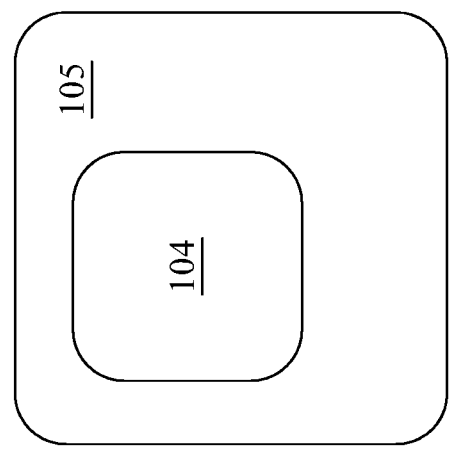
Figure 6:
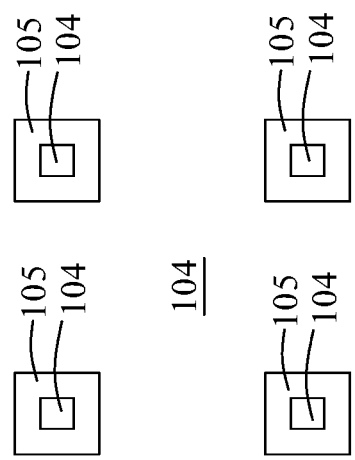

In some embodiments, a top cross-sectional view of the alignment pattern 105 can be in various shapes along a line BB' of FIG. 1. In some embodiments as shown in FIG. 3, the top cross-sectional view of the alignment pattern 105 is in an annular shape. In some embodiments as shown in FIG. 4, the top cross-sectional view of the alignment pattern 105 is in a rectangular frame shape. In some embodiments as shown in FIG. 5, the top cross-sectional view of the alignment pattern 105 is in a pentagonal frame shape. In some embodiments as shown in FIG. 6, the top cross-sectional view of the alignment pattern 105 is in a polygonal frame shape. In some embodiments as shown in FIG. 7, the alignment pattern 105 includes several patterns, and each of patterns can be in same or different shapes from each other from the top cross-sectional view.

In some embodiments, the first semiconductor structure 100a includes a first conductive pad 106 surrounded by the first dielectric layer 104. In some embodiments, the first conductive pad 106 is electrically connected to the first interconnect structure 102b. In some embodiments, the first conductive pad 106 is at least partially exposed from the first dielectric layer 104. In some embodiments, the first conductive pad 106 is adjacent to the alignment pattern 105. In some embodiments, the first conductive pad 106 is a bonding pad configured to bond or connect with an electrical component. In some embodiments, the first conductive pad 106 includes conductive material such as copper, silver, gold or the like.

In some embodiments, the second semiconductor structure 100b is disposed over the first semiconductor structure 100a. In some embodiments, the second semiconductor structure 100b includes a second substrate 107, a second dielectric 108a, a second interconnect structure 108b, a second dielectric layer 109 and a second conductive pad 110. In some embodiments, the second semiconductor structure 100b is a second die bonded with the first semiconductor structure 100a. In some embodiments, the second dielectric layer 109 is disposed over and bonded with the first dielectric layer 104. In some embodiments, the second dielectric layer 109 includes dielectric material such as silicon oxide, silicon oxynitride, polyimide, silicon nitride or the like. In some embodiments, the second dielectric layer 109 and the first dielectric layer 104 include same or different dielectric material. In some embodiments, the second dielectric layer 109 is in contact with a portion of the first conductive pad 106. In some embodiments, the second dielectric layer 109 covers and contacts the alignment pattern 105.

In some embodiments, the second conductive pad 110 is surrounded by the second dielectric layer 109. In some embodiments, the second conductive pad 110 is at least partially exposed from the second dielectric layer 109. In some embodiments, the second conductive pad 110 is disposed over and bonded with the first conductive pad 106, In some embodiments, the second conductive pad 110 is in contact with a portion of the first dielectric layer 104. In some embodiments, the second conductive pad 110 is vertically aligned with the first conductive pad 106. In some embodiments, the second conductive pad 110 is a bonding pad configured to bond or connect with an electrical component. In some embodiments, the second conductive pad 110 includes conductive material such as copper, silver, gold or the like.

In some embodiments, the second dielectric 108a is disposed over the second. dielectric layer 109 and the second conductive pad 110. In some embodiments, the second dielectric 108a surrounds the second interconnect structure 108b. In some embodiments, the second dielectric 108a includes several dielectric layers stacking over each other. In some embodiments, the second dielectric 108a includes dielectric material such as silicon oxide, silicon oxynitride, polyimide, silicon nitride or the like. In some embodiments, the second dielectric layer 109 and the second dielectric 108a include same or different dielectric material. In some embodiments, the second dielectric 108a is an inter-metal dielectric (IMD).

In some embodiments, the second interconnect structure 108b includes several conductive members and several conductive vias surrounded by the second dielectric 108a. In some embodiments, the conductive member and the conductive via are electrically connected with each other within the second dielectric 108a. In some embodiments, the second interconnect structure 108b is electrical routing within the second semiconductor structure 100b. In some embodiments, the second interconnect structure 108b includes a second conductive plug 108c extending within the second dielectric 108a and towards the second substrate 107. In some embodiments, the second conductive plug 108c is partially exposed from the second dielectric 108a. In some embodiments, the second conductive pad 110 is electrically connected to the second interconnect structure 108b. In some embodiments, the second interconnect structure 108b is electrically connected to the first interconnect structure 102b through the first conductive pad 106 and the second conductive pad 110. In some embodiments, the second interconnect structure 108b includes conductive material such as copper, silver, gold or the like.

In some embodiments, the second semiconductor structure 100b includes a second seal ring structure 108d surrounded by the second dielectric 108a. In some embodiments, the second seal ring structure 108d extends towards the second substrate 107 and extends along a periphery of the second dielectric 108a. In some embodiments, the second seal ring structure 108d is configured to protect electrical components in the second semiconductor structure 100b from contamination or damage. In some embodiments, the second seal ring structure 108d is a dummy structure and is electrically isolated from the second interconnect structure 108b or other electrical components in the second semiconductor structure 100b. In some embodiments, the second seal ring structure 108d is connected to an electrical ground. In some embodiments, the second seal ring structure 108d includes conductive material such as copper, silver, gold or the like. In some embodiments, the second seal ring structure 108d is in a strip configuration or a ring shape from a top cross-sectional view.

In some embodiments, the second substrate 107 is disposed over the second dielectric 108a. In some embodiments, the second substrate 107 includes semiconductive material such as silicon, germanium, gallium, arsenic, or a combination thereof. In some embodiments, the second substrate 107 is a semiconductor wafer. In some embodiments, the second substrate 107 is a silicon substrate.

Figure 8:
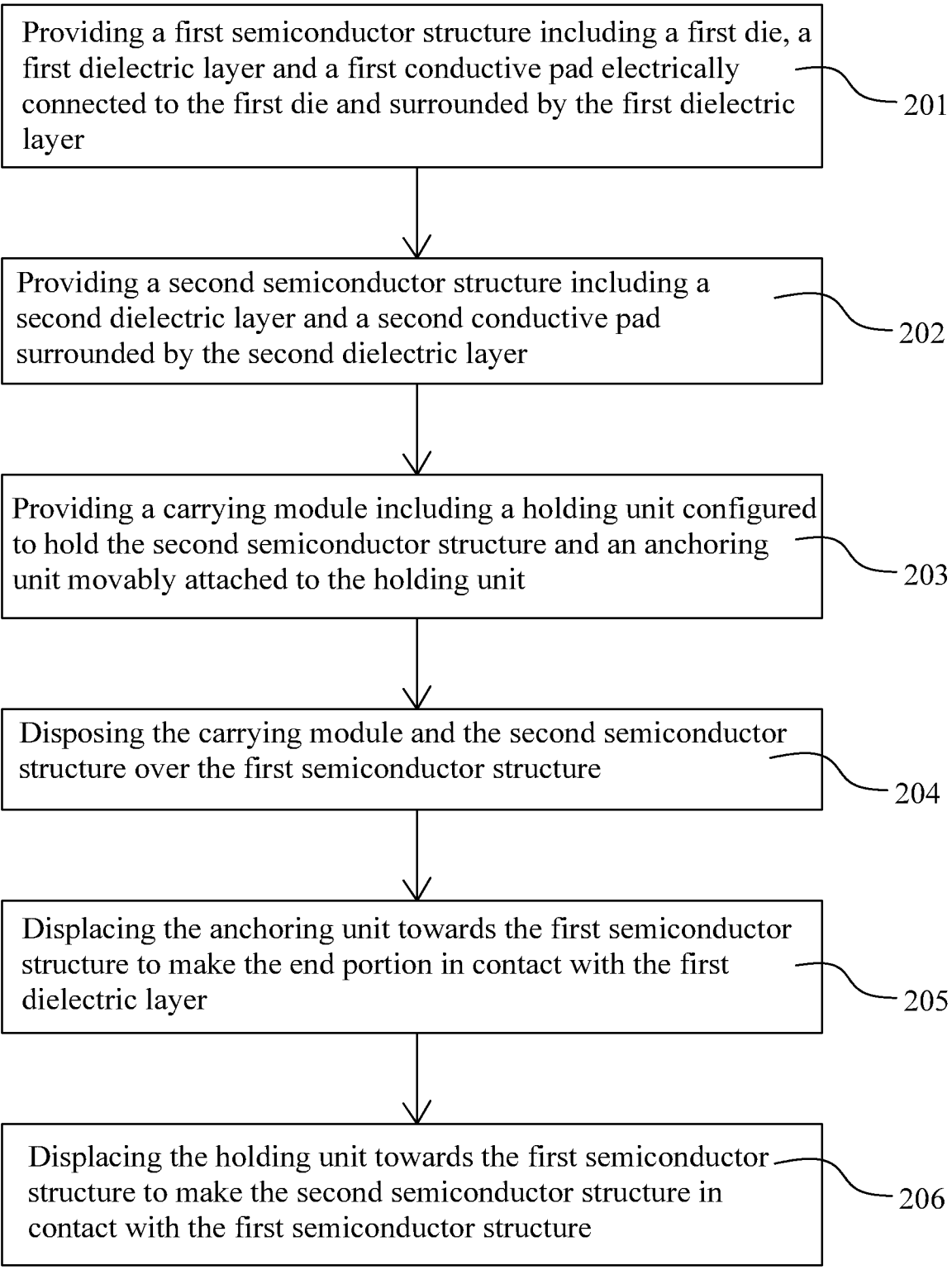
FIG. 8 is a flowchart of a method for forming a semiconductor structure in accordance with some embodiments of the present disclosure.

In the present disclosure, a method of forming a bonded structure 100 is also disclosed. In some embodiments, the bonded structure 100 is formed by a method 200. The method 200 includes a number of operations and the description and illustration are not deemed as a limitation as the sequence of the operations. FIG. 8 is an embodiment of the method 200 of forming the bonded structure 100. The method 200 includes a number of operations (201, 202, 203, 204, 205 and 206).

Figure 9:
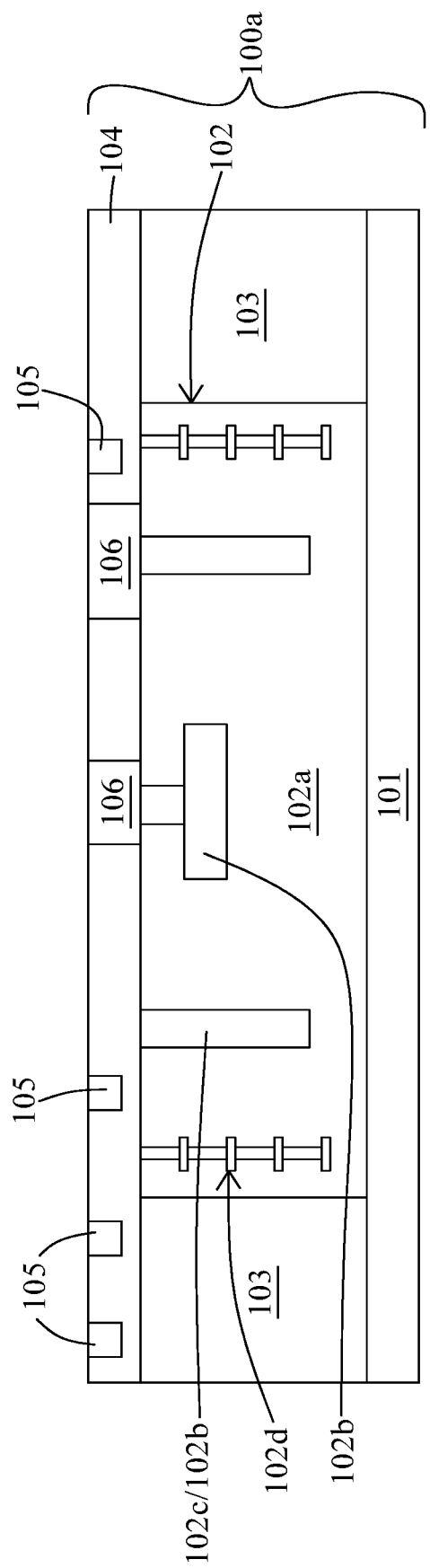
FIGS. 9 to 21 are cross-sectional views of one or more stages of the method for forming a semiconductor structure in accordance with some embodiments of the present disclosure.

In operation 201, a first semiconductor structure 100a is provided as shown in FIG. 9. In some embodiments, the first semiconductor structure 100a includes a first die 102, a first dielectric layer 104 and a first conductive pad 106 electrically connected to the first die 102 and surrounded by the first dielectric layer 104. In some embodiments, the first semiconductor structure 100*a* has similar configuration as the first semiconductor structure 100*a* discussed above or illustrated in FIG. 1.

Figure 10:
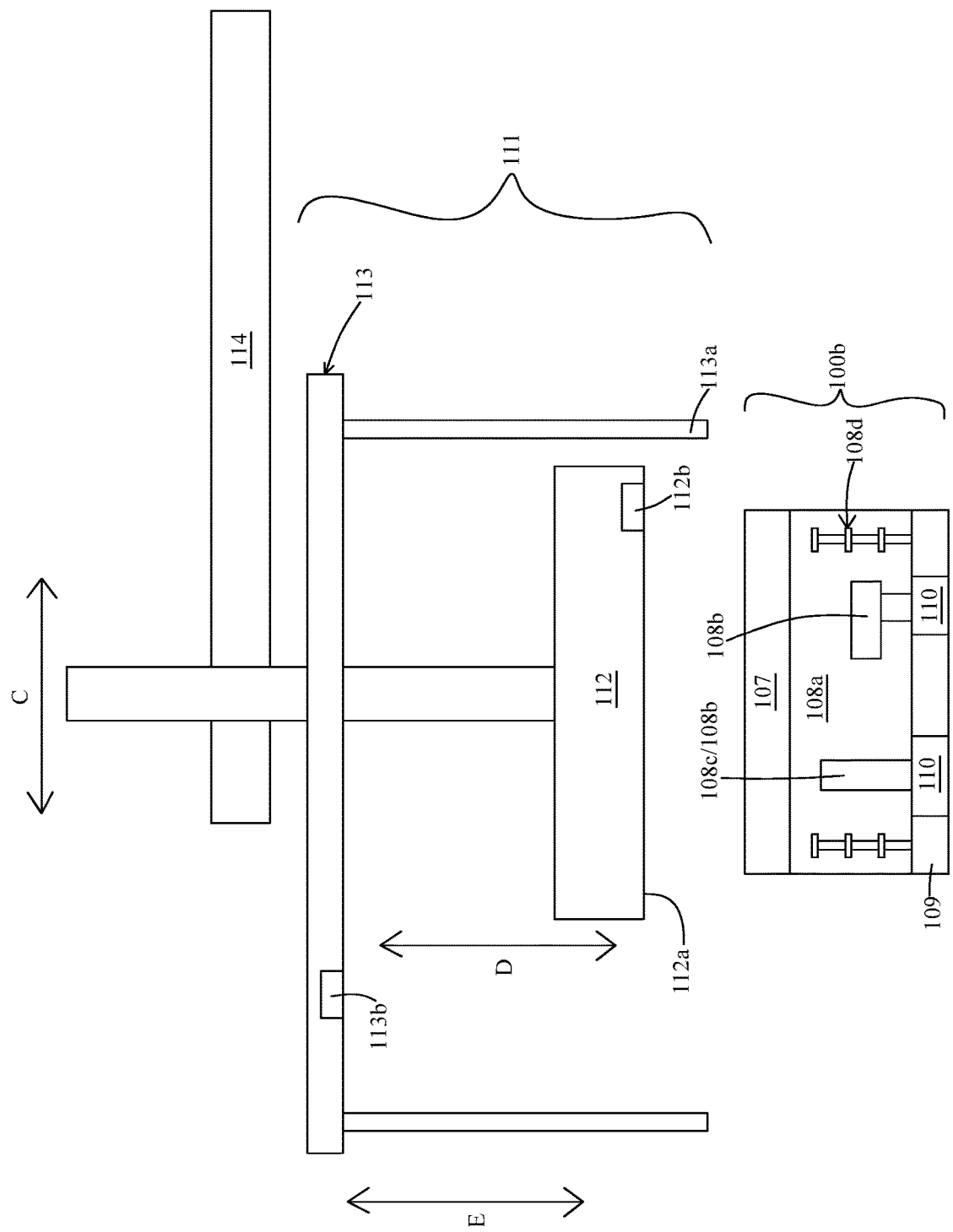

In operation 202, a second semiconductor structure 100*b* is provided as shown in FIG. 10. In some embodiments, the second semiconductor structure 1100 includes a second dielectric layer 109 and a second conductive pad 110 surrounded by the second dielectric layer 109. In some embodiments, the second semiconductor structure 100*b* has similar configuration as the second semiconductor structure 100*b* discussed above or illustrated in FIG. 1.

In operation 203, a carrying module 111 is provided as shown in FIG. 10. In some embodiments, the carrying module 111 is configured to pick up the second semiconductor structure 100*b*, transport the second semiconductor structure 100*b* to a predetermined location and unload the second semiconductor structure 100*b* at a predetermined place. In some embodiments, the carrying module 111 is movably fixed to a rail 114. In some embodiments, the carrying module 111 is slidable along the rail 114. In some embodiments, the carrying module 111 is movable along a first direction C. In some embodiments, the carrying module 111 is horizontally movable.

In some embodiments, the carrying module 111 includes a holding unit 112 configured to hold the second semiconductor structure 100*b* and an anchoring unit 113 movably attached to the holding unit 112, In some embodiments, the holding unit 112 is configured to pick up the second semiconductor structure 100*b* by sucking, gripping or any other suitable means. In some embodiments, the holding unit 112 includes a holding surface 112*a* for receiving the second semiconductor structure 100*b*, such that the second semiconductor structure 100*b* is attachable to and detachable from the holding surface 112*a*. In some embodiments, the holding unit 112 is movably attached to the rail 114. In some embodiments, the holding unit 112 is movable along a second direction D. In some embodiments, the holding unit 112 is vertically movable relative to the rail 114. In some embodiments, a first sensor 112*b* is disposed on the holding unit 112. In some embodiments, the first sensor 112*b* is configured to sense and monitor a position of the holding unit 112. In some embodiments, the first sensor 112*b* is installed at a periphery of the holding surface 112*a*.

In some embodiments, the anchoring unit 113 surrounds the holding unit 112. In some embodiments, the anchoring unit 113 is movable relative to the holding unit 112. In some embodiments, the anchoring unit 113 is movable along a third direction E. In some embodiments, the anchoring unit 113 is vertically movable. In some embodiments, the anchoring unit 113 includes an end portion 113*a* configured to temporality fixed on the first semiconductor structure 100*a*. In some embodiments, the end portion 113*a* is configured to anchor the anchoring unit 113 on the first semiconductor structure 100*a*. In some embodiments, the end portion 113*a* is movable relative to the holding unit 112. In some embodiments, a second sensor 113*b* is disposed on the anchoring unit 113. In some embodiments, the second sensor 113*b* is configured to sense and monitor a position of the end portion 113*a*. In some embodiments, the second sensor 113*b* is installed at a periphery of the anchoring unit 113. In some embodiments, the first sensor 112*b* and the second sensor 113*b* are optical sensor, infrared sensor or the like.

Figure 11:
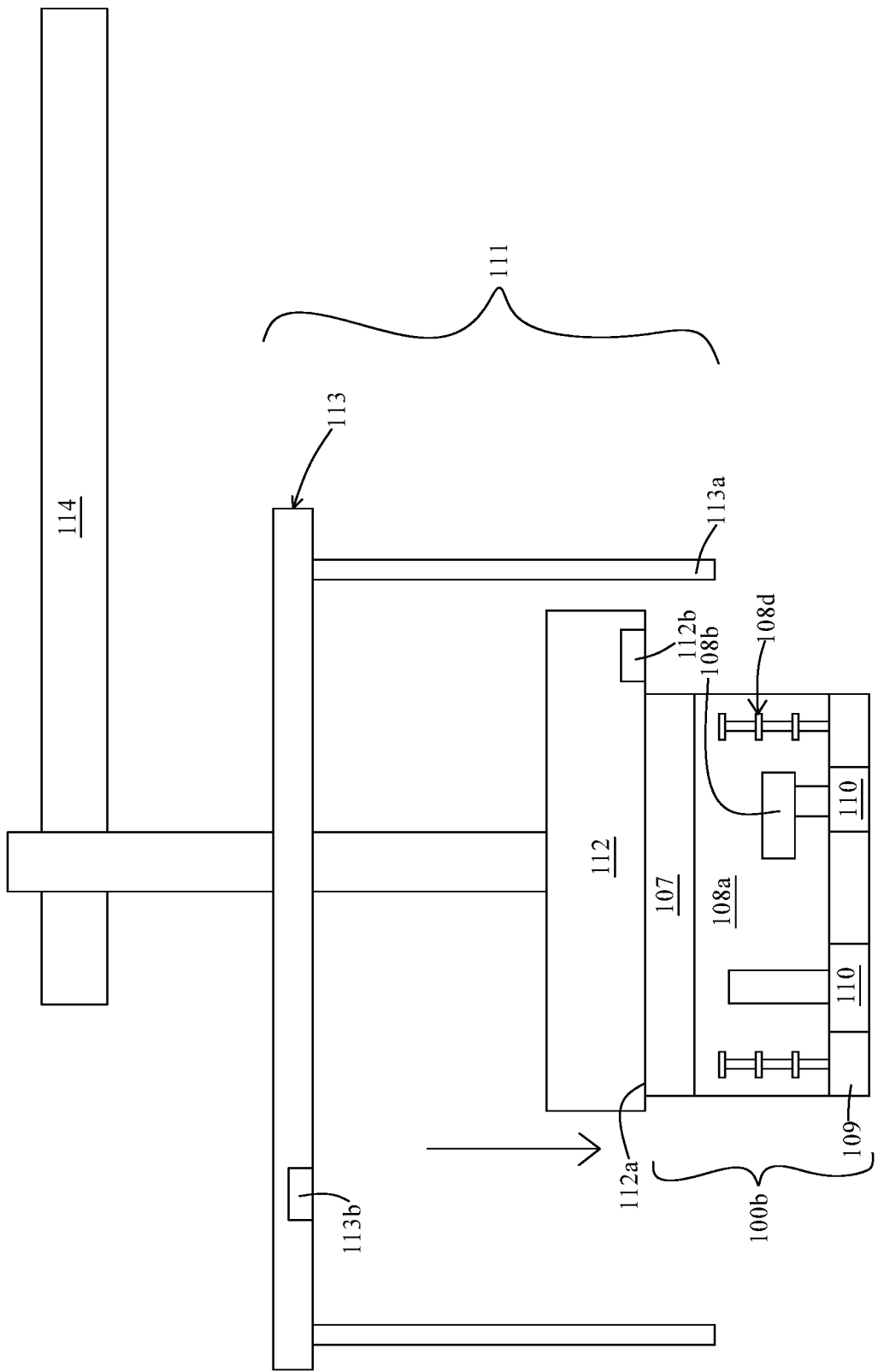

In some embodiments, the carrying module 111 is disposed above the second, semiconductor structure 100*b* to pick up the second semiconductor structure 100*b* by the carrying module 111 as shown in FIG. 11. In some embodiments, the carrying module 111 is disposed above the second semiconductor structure 100*b*, and then the holding unit 112 is moved downwardly (for example as an arrow shown in FIG. 11) towards the second semiconductor structure 100*b* until the holding unit 112 touches the second semiconductor structure 100*b*. In some embodiments, the holding surface 112*a* touches the second substrate 107. In some embodiments, the holding unit 112 sucks the second semiconductor structure 100*b* towards the holding surface 112*a*.

Figure 12:
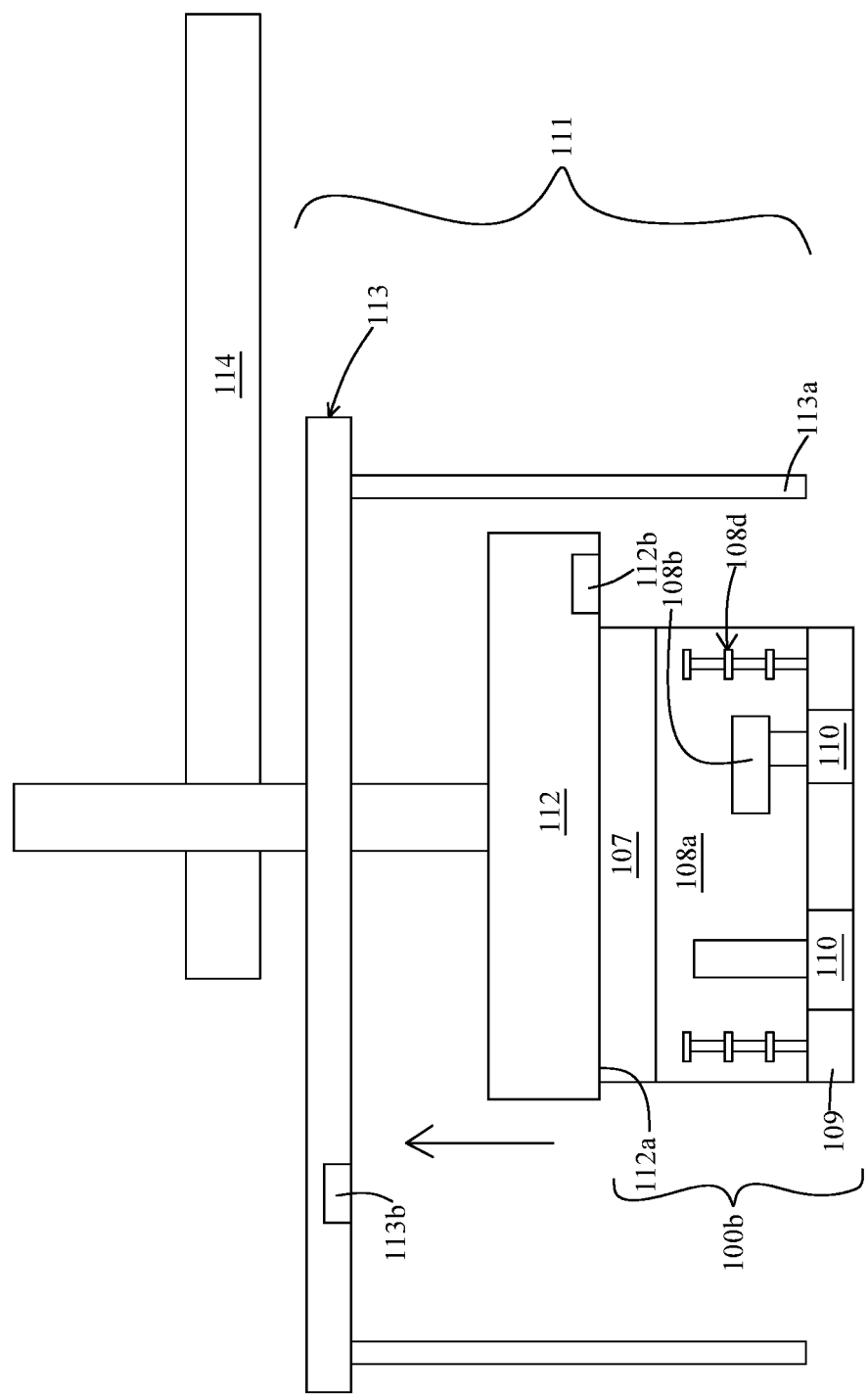

In some embodiments, after contacting the second semiconductor structure 100*b* by the holding unit 112, the holding unit 112 is moved upwardly downwardly (for example as an arrow shown in FIG. 12) to pick up the second semiconductor structure 100*b* as shown in FIG. 12. In some embodiments, the second semiconductor structure 100*b* is at least partially surrounded by the anchoring unit 113 after the upward movement of the holding unit 112. In some embodiments, the second semiconductor structure 100*b* is held and carried by the holding unit 112 during and after the upward movement of the holding unit 112.

Figure 13:
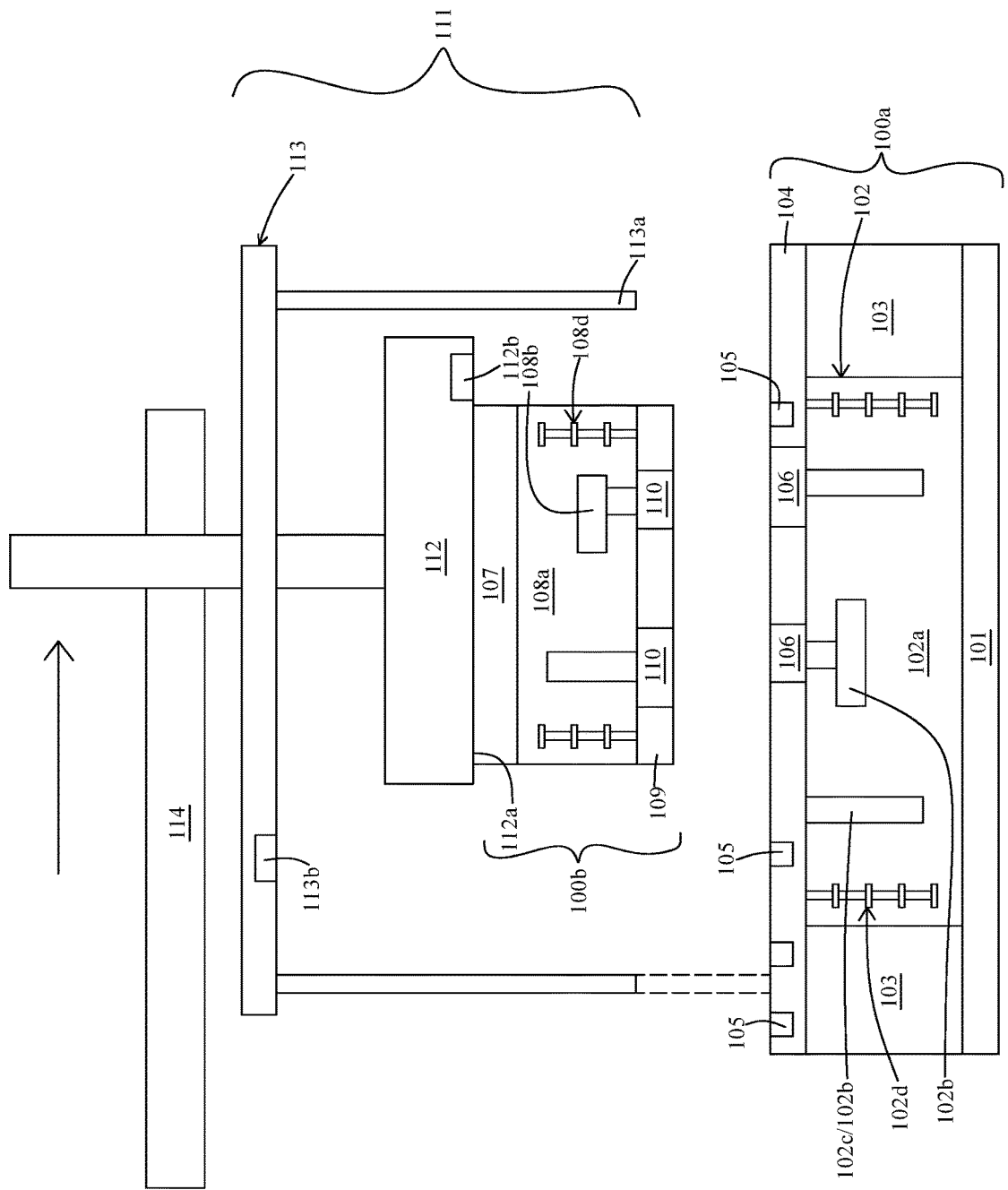

In operation 204, the carrying module 111 and the second semiconductor structure 100*b* are disposed over the first semiconductor structure 100*a* as shown in FIG. 13. In some embodiments, the carrying module 111 is moved along the rail 114 to dispose the second semiconductor structure 100*b* over the first semiconductor structure 100*a*. In some embodiments, the carrying module 111 is moved horizontally (for example as an arrow shown in FIG. 13) to carry the second semiconductor structure 100*b*. In some embodiments, the carrying module 111 is moved by a stepping motor or the like. In some embodiments, the stepping motor is configured to calculate a travelling distance that the carrying module 111 subsequently travels towards and above the second semiconductors structure 100*b*.

In some embodiments, the disposing of the second semiconductor structure 100*b* over the first semiconductor structure 100*a* includes aligning the second semiconductor structure 100*b* with the first semiconductor structure 100*a*. In some embodiments, the alignment includes aligning the second conductive pad 110 with the first conductive pad 106. In some embodiments, the carrying module 111 is moved to align the second conductive pad 110 with the first conductive pad 106. In some embodiments, the alignment includes aligning the end portion 113*a* with the alignment pattern 105 of the first semiconductor structure 100*a*. In some embodiments, the end portion 113*a* is surrounded by the alignment pattern 105 from the top view. In some embodiments, the second conductive pad 110 is aligned with the first conductive pad 106 when the end portion 113*a* is aligned with the alignment pattern 105.

In some embodiments, the alignment includes sensing a position of the first semiconductor structure 100*a* by the first sensor 112*b* and/or the second sensor 113*b*. In some embodiments, the alignment includes sensing a position of the alignment pattern 105 and/or a position of the end portion 113*a* by the first sensor 112*b* and/or the second sensor 113*b*. In some embodiments, the alignment includes sensing a position of the first seal ring structure 102*d* and/or a position of the first conductive plug 102*c* by the first sensor 112*b* and/or the second sensor 113*b*. In some embodiments, the alignment pattern 105 is sensible by the first sensor 112*b* and/or the second sensor 113*b* via visible light, infrared or any other suitable electromagnetic radiations with suitable wavelengths. In some embodiments, the first sensor 112*b* and the second sensor 113*b* monitor the alignment and transmit suitable signals to a central processing unit (not shown), and then the carrying module 111 would move accordingly until the second semiconductor structure 100b is aligned with the first semiconductor structure 100a.

Figure 14:
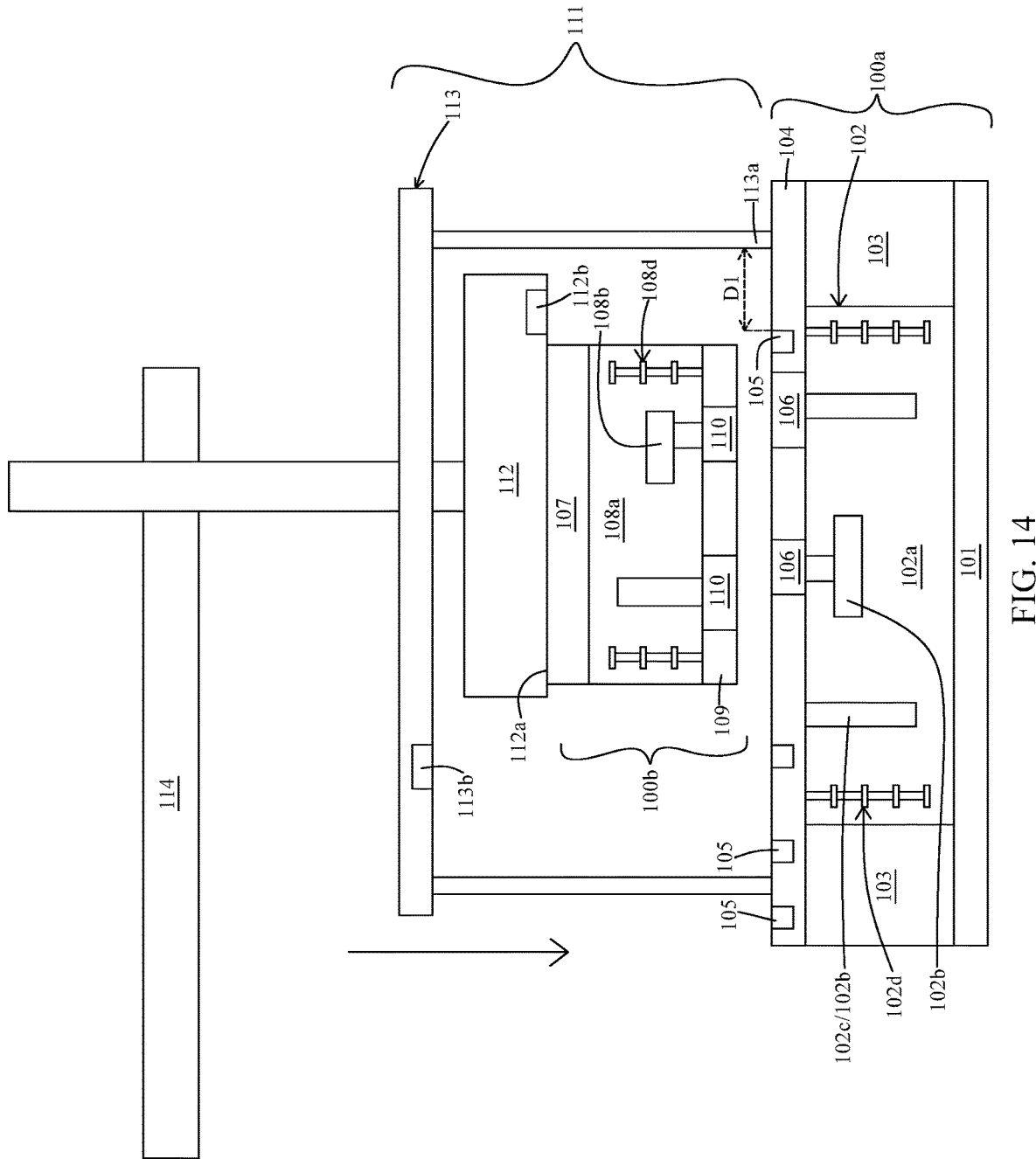

In operation 205, the anchoring unit 113 is displaced towards the first semiconductor structure 100a to make the end portion 113a in contact with the first dielectric layer 104 as shown in FIG. 14. In some embodiments, the anchoring unit 113 is displaced towards the first semiconductor structure 100a to make at least a portion of the anchoring unit 113 in contact with the first dielectric layer 104. In some embodiments, the anchoring unit 113 moves towards the first semiconductor structure 100a (for example as an arrow shown in FIG. 14) until the end portion 113a lands on the first dielectric layer 104. In some embodiments, the anchoring unit 113 moves towards the first semiconductor structure 100a at a first speed when a distance between the end portion 113a and the first dielectric layer 104 is substantially greater than or equal to 1 centimeter (cm). In some embodiments, the anchoring unit 113 moves towards the first semiconductor structure 100a at a second speed slower than the first speed when the distance between the end portion 113a and the first dielectric layer 104 is substantially less than 1 centimeter (cm).

In some embodiments, the end portion 113a is in contact with a predetermined position of the first dielectric layer 104 surrounded by the alignment pattern 105. In some embodiments, the end portion 113a is in contact with a predetermined position of the first dielectric layer 104 spaced apart from the alignment pattern 105 in a predetermined distance D1. In some embodiments, the end portion 113a is fixed on the first dielectric layer 104. In some embodiments, the second semiconductor structure 100b is spaced apart from the first semiconductor structure 100a after the end portion 113a is in contact with the first dielectric layer 104. In some embodiments, the first sensor 112b and the second sensor 113b sense and monitor if the end portion 113a is in contact with the predetermined position of the first dielectric layer 104. In some embodiments, the bolding unit 112 would laterally displace if the first conductive pad 106 is not aligned with the second conductive pad 110. As a result, an adjustment of a position of the second semiconductor structure 100b can be performed by lateral movement of the holding unit 112. In some embodiments, the adjustment is performed before vertical movement of the holding unit 112 towards the first semiconductor structure 100a (for example as an arrow shown in FIG. 15).

Figure 15:
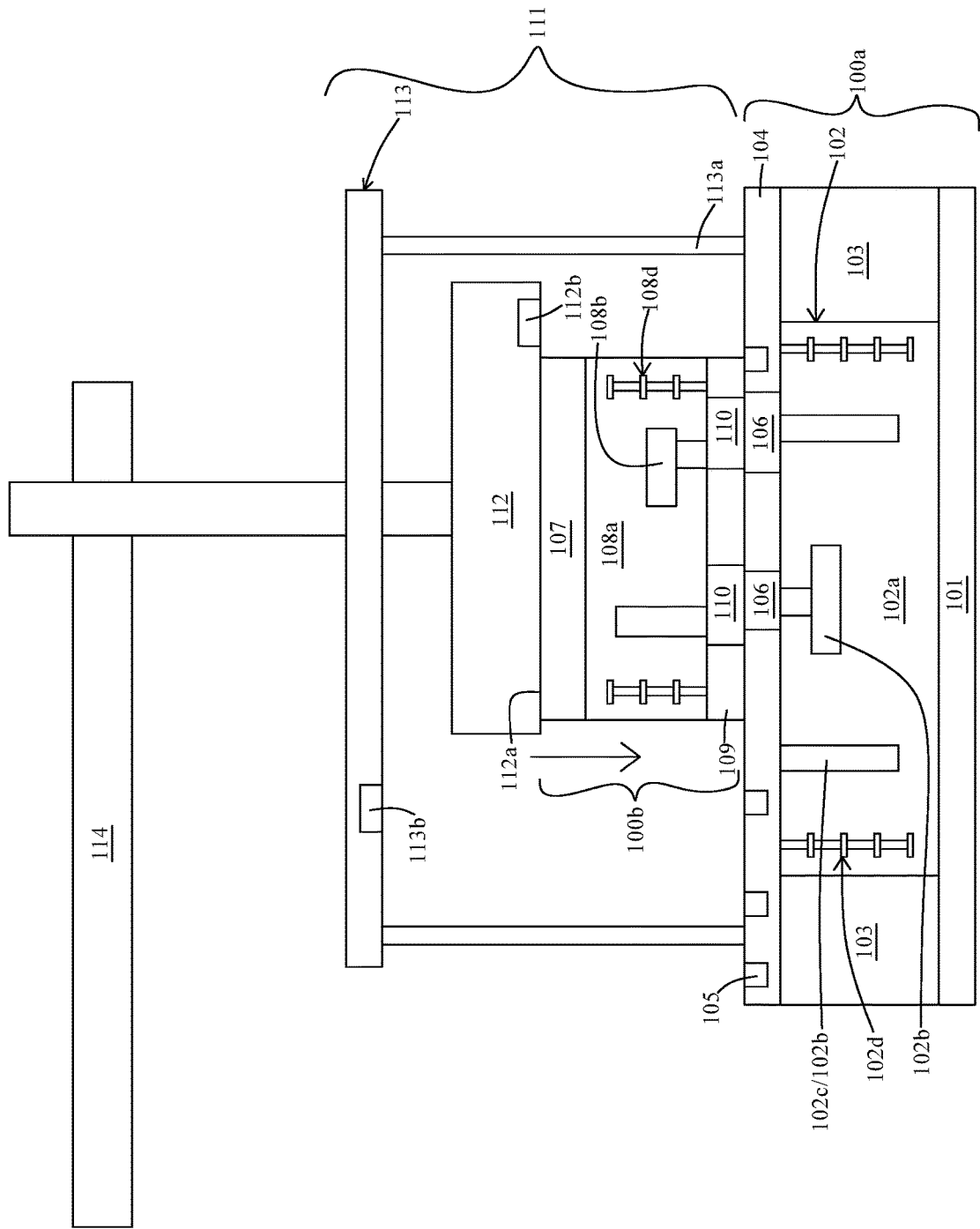

In operation 206, the holding unit 112 is displaced towards the first semiconductor structure 100a to make the second semiconductor structure 100b contact with the first semiconductor structure 100a as shown in FIG. 15. In some embodiments, the displacement of the anchoring unit 113 (the operation 205) is performed prior to the displacement of the holding unit 112 (the operation 206). In some embodiments, the holding unit 112 is displaced towards the first semiconductor structure (for example as an arrow shown in FIG. 15) to make the second dielectric layer 109 in contact with the first dielectric layer 104 and to make the second conductive pad 110 in contact with the first conductive pad 106.

In some embodiments, the holding unit 112 moves towards the first semiconductor structure 100a until the second dielectric layer 109 is in contact with the first dielectric layer 104 and the second conductive pad 110 is in contact with the first conductive pad 106. In some embodiments, a hybrid bonding between the first semiconductor structure 100a and the second semiconductor structure 100b is formed. In some embodiments, the hybrid bonding includes a bonding between the first dielectric layer 104 and the second dielectric layer 109 and a bonding between the first conductive pad 116 and the second conductive pad 110. In some embodiments, the end portion 113a is fixed and remains contact with the first dielectric layer 104 during the displacement of the holding unit 112 towards the first semiconductor structure 100a. In some embodiments, at least a portion of the anchoring unit 113 remains contact with the first dielectric layer 104 during the displacement of the holding unit 112 towards the first semiconductor structure 100a.

Figure 16:
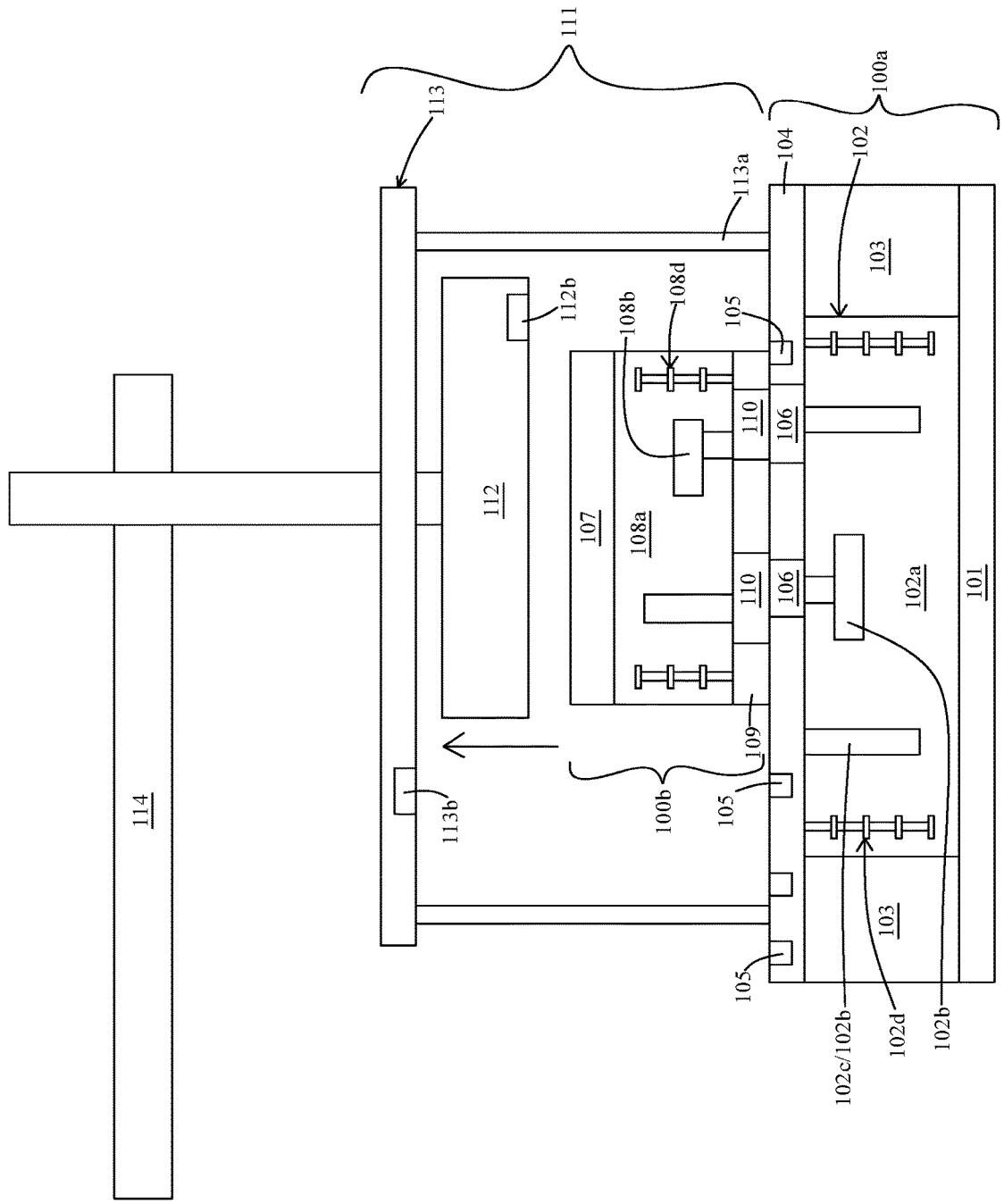

In some embodiments, the second semiconductor structure 100b is released from the holding unit 112 upon or after the second semiconductor structure 100b is in contact with the first semiconductor structure 100a as shown in FIG. 16. In some embodiments, after the formation of the hybrid bonding, the second semiconductor structure 100b is released from the holding unit 112 and the holding unit 112 is displaced away from the first semiconductor structure 100a and the second semiconductor structure 100b (for example as an arrow shown in FIG. 16). In some embodiments, the second semiconductor structure 100b is released from the holding unit 112 after the second. dielectric layer 109 is bonded with the first dielectric layer 104 and the second conductive pad 110 is bonded with the first conductive pad 106. In some embodiments, at least the portion of the anchoring unit 113 remains contact with the first dielectric layer 104 during the displacement of the holding unit 112 away from the second semiconductor structure 100b and the first semiconductor structure 100a.

Figure 17:
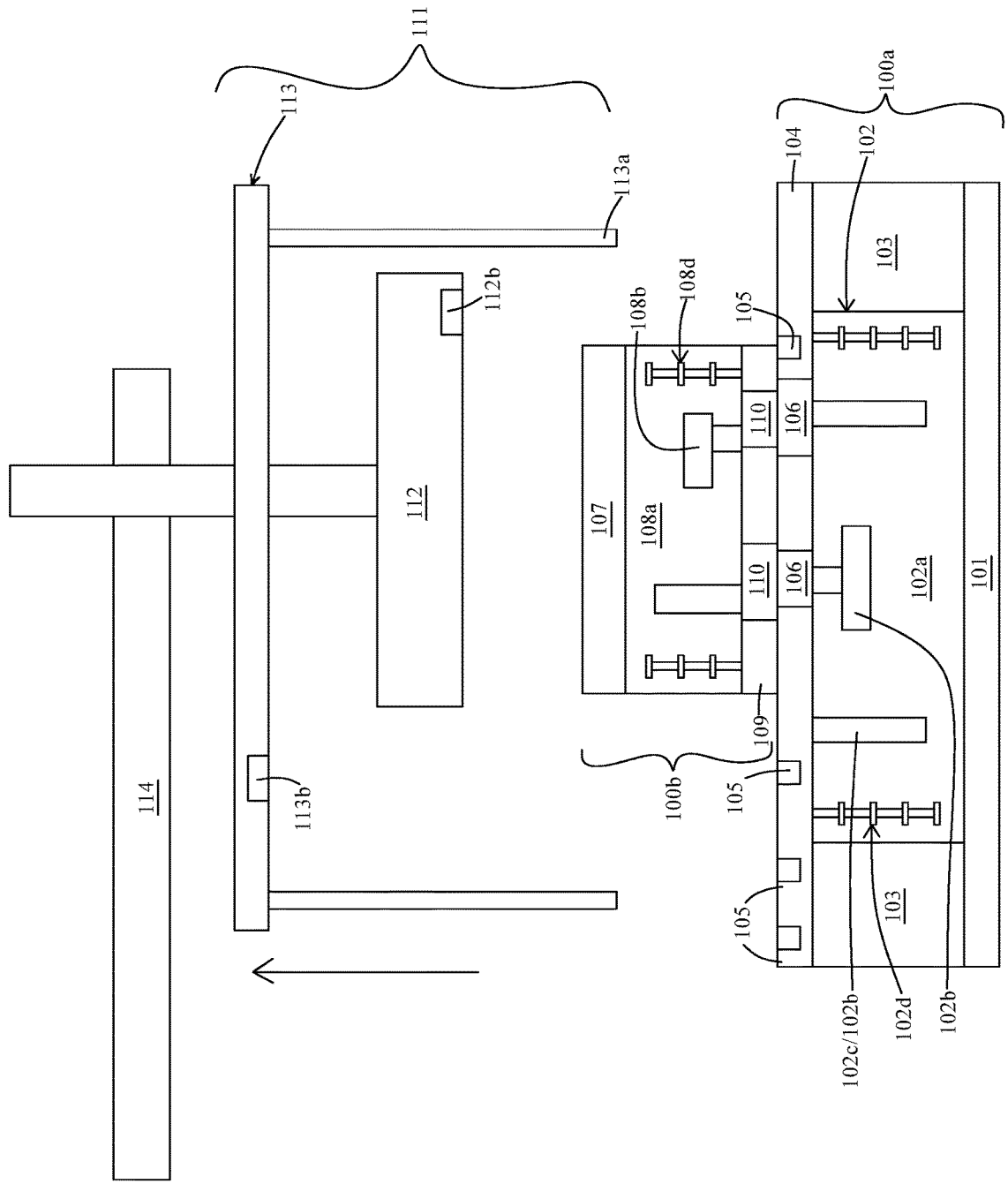

In some embodiments, after the holding unit 112 is moved away from the first semiconductor structure 100a and the second semiconductor structure 100b, the anchoring unit 113 is displaced away from the first semiconductor structure 100a as shown in FIG. 17. In some embodiments, the anchoring unit 113 is moved away from the first dielectric layer 104 (for example as an arrow shown in FIG. 17). In some embodiments, the end portion 113a is moved away from the first dielectric layer 104 and the alignment pattern 105.

Figure 18:
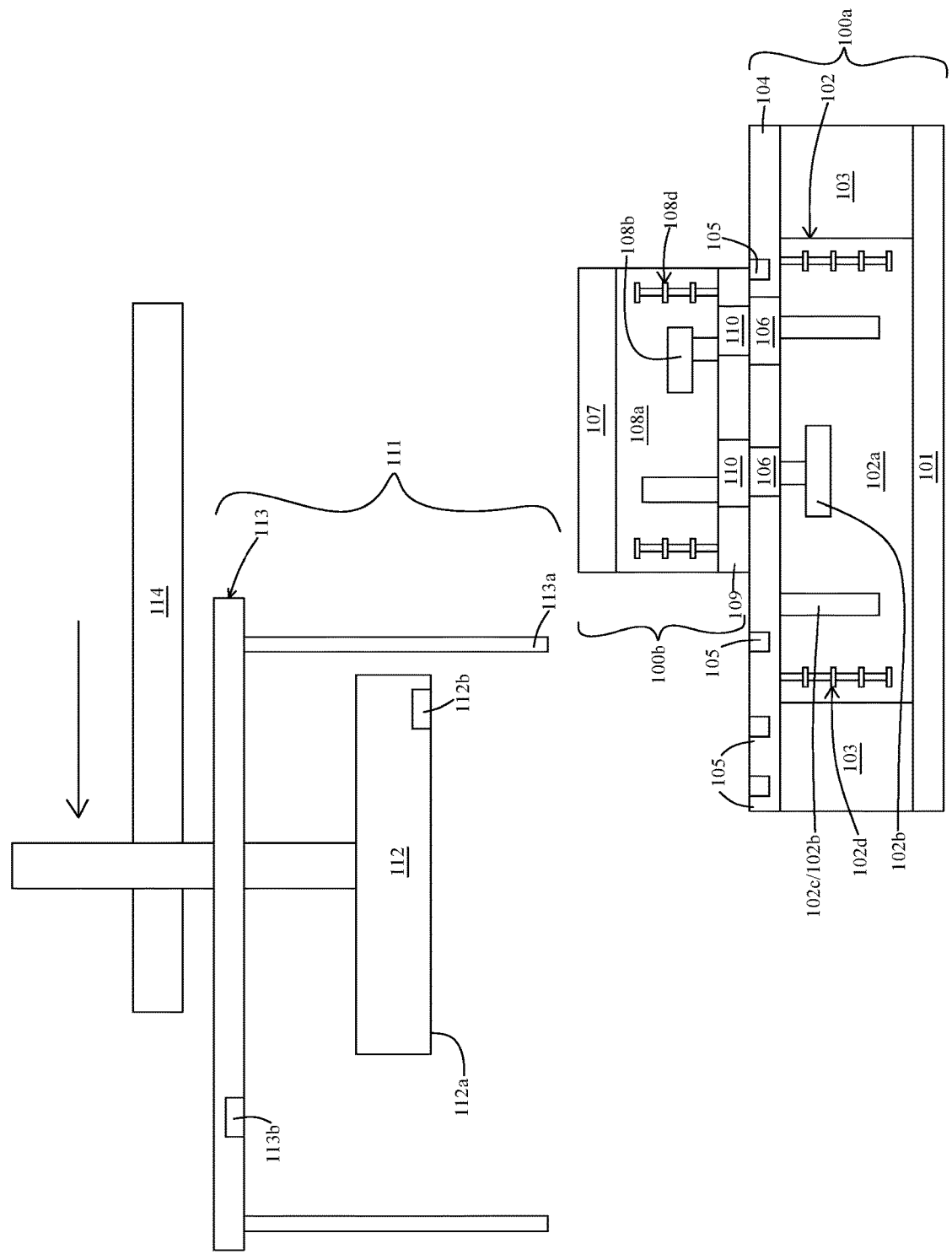
Figure 19:
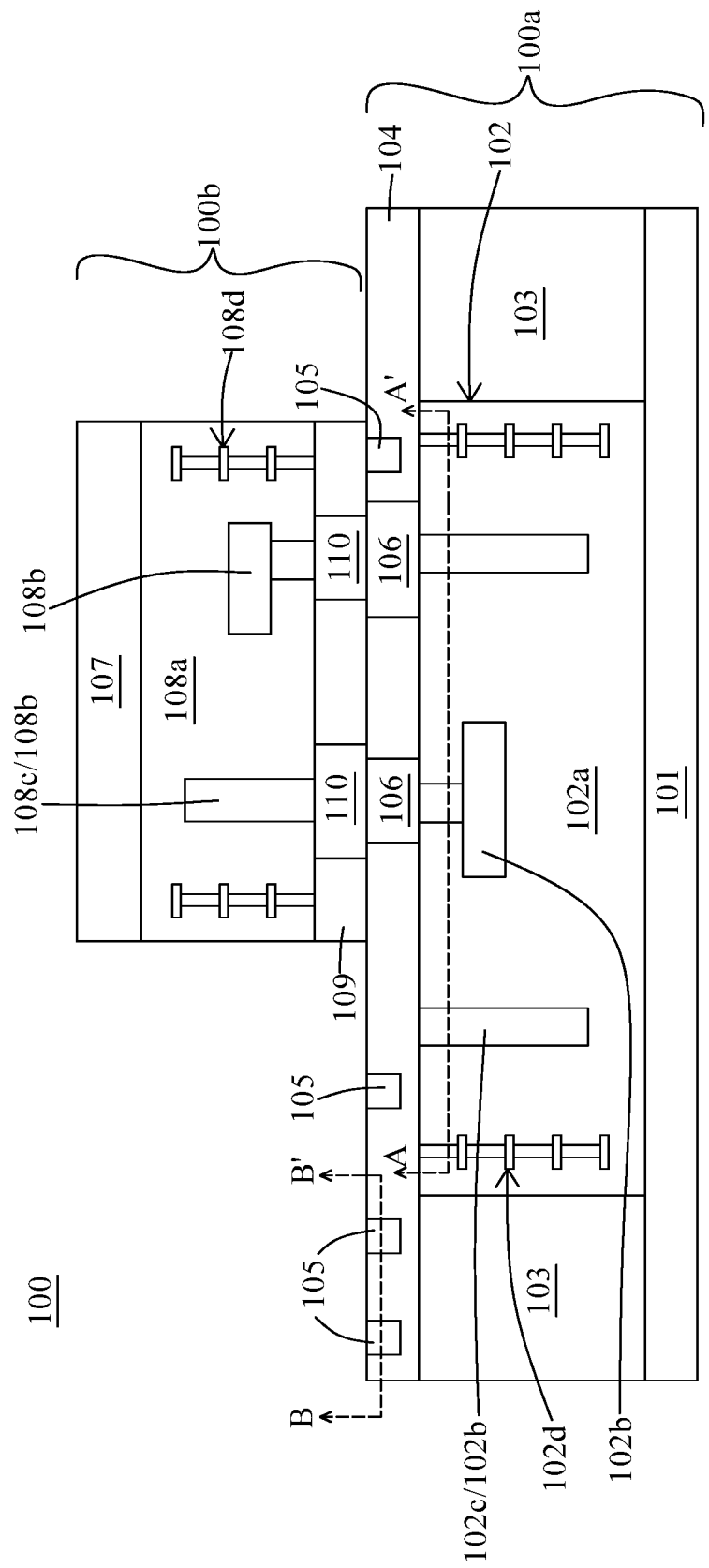
Figure 20:
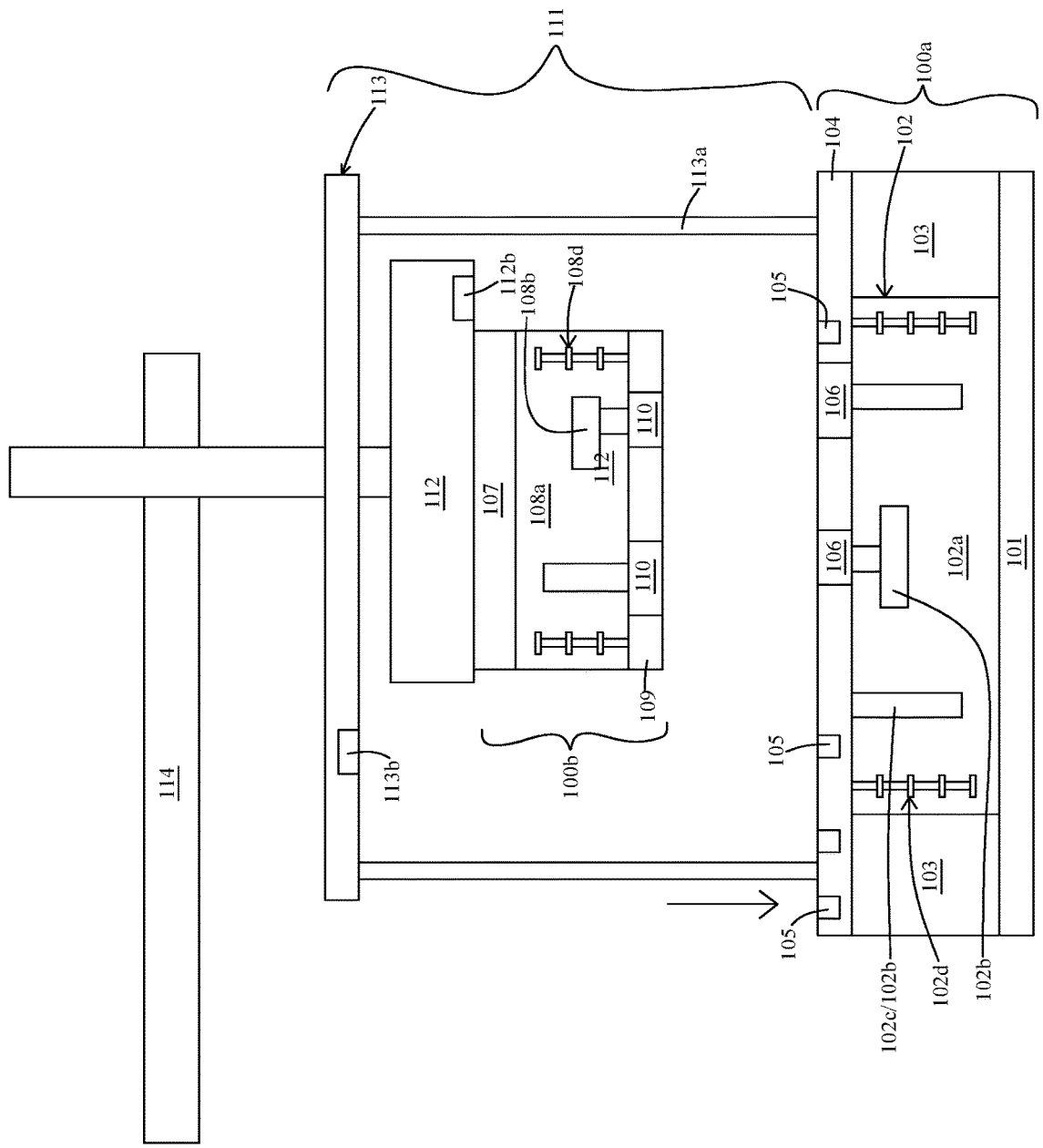

In some embodiments, after the holding unit 112 and the anchoring unit 113 are displaced away from the first semiconductor structure 100a and the second. semiconductor structure 100b, the carrying module 111 is moved away from the first semiconductor structure 100a and the second semiconductor structure 100b as shown in FIG. 18. In some embodiments, the carrying module 111 is moved away along the rail 114. In some embodiments, a bonded structure 100 is formed as shown in FIG. 19. In some embodiments, the bonded structure 100 has similar configuration as the one shown in FIG. 1.

Figure 21:
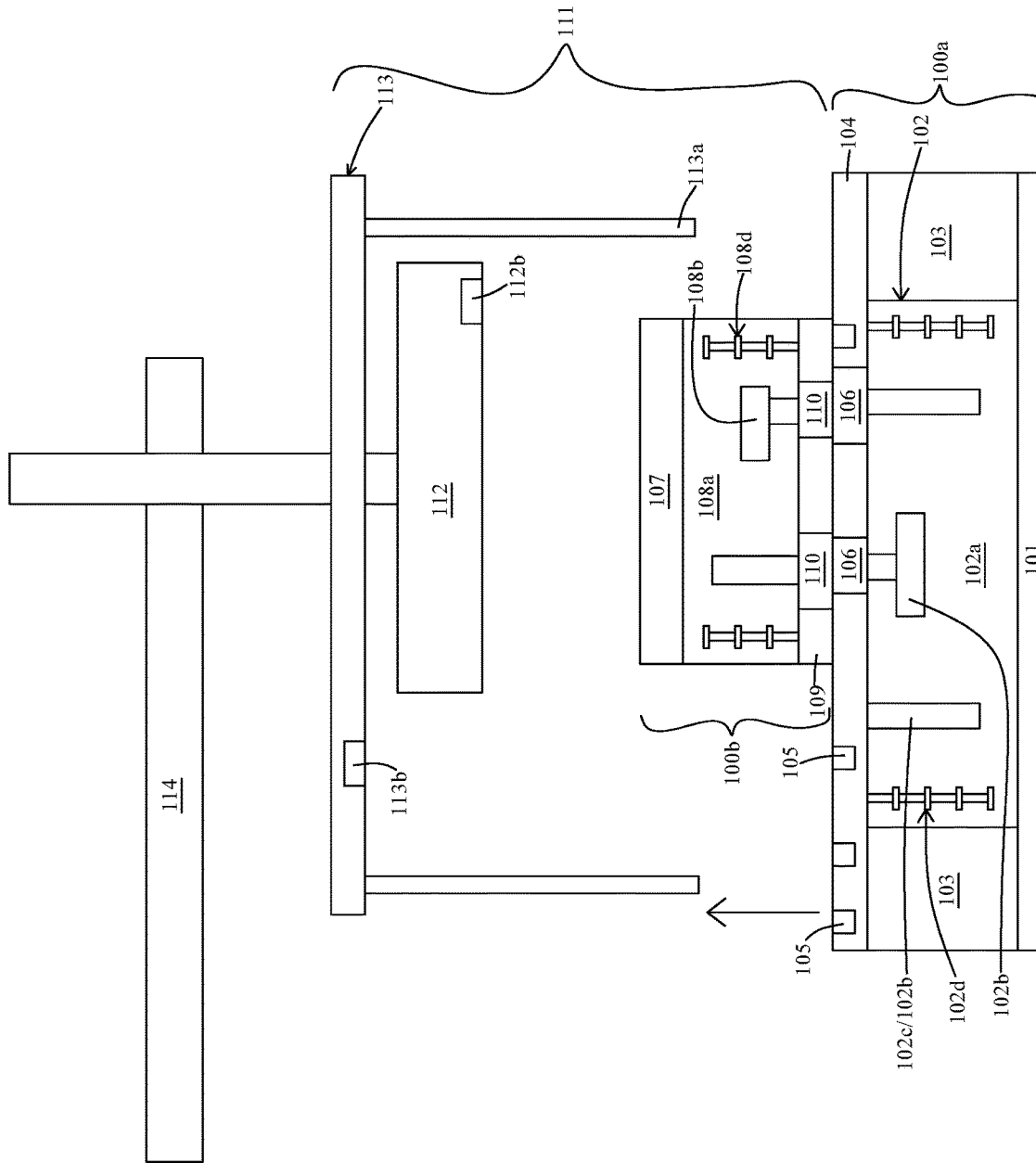

In some embodiments, instead of displacing the anchoring unit 113 or the end portion 113a towards the first semiconductor structure 100a as shown in FIG. 14 after the operation 204, the end portion 113a of the anchoring unit 113 is extended towards the first semiconductor structure 100a as shown in FIG. 21. In some embodiments, the end portion 113a is extendable and retractable. In some embodiments, the operation 206 is performed after the extension of the end portion 113a.

In some embodiments, after the holding unit 112 is moved away from the first semiconductor structure 100a and the second semiconductor structure 100b as shown in FIG. 16, the end portion 113a is retracted away from the first semiconductor structure 100a as shown in FIG. 22, instead of displacing the anchoring unit 113 or the end portion 113a towards the first semiconductor structure 100a as shown in FIG. 17.

One aspect of this disclosure relates to a method of forming a bonded structure. The method includes providing a first semiconductor structure including a first die, a first dielectric layer and a first conductive pad electrically connected to the first die and surrounded by the first dielectric layer; providing a second semiconductor structure including a second dielectric layer and a second conductive pad surrounded by the second dielectric layer; providing a carrying module including a holding unit configured to hold the second semiconductor structure and an anchoring unit movably attached to the holding unit, wherein the anchoring unit includes an end portion configured to be temporarily fixed on the first semiconductor structure; disposing the carrying module and the second semiconductor structure over the first semiconductor structure; displacing the anchoring unit towards the first semiconductor structure to make the end portion in contact with the first dielectric layer; and displacing the holding unit towards the first semiconductor structure to make the second semiconductor structure in contact with the first semiconductor structure.

In some embodiments, the displacement of the anchoring unit is performed prior to the displacement of the holding unit. In some embodiments, the holding unit is displaced towards the first semiconductor structure to make the second dielectric layer in contact with the first dielectric layer and to make the second conductive pad in contact with the first conductive pad. In some embodiments, the carrying module is moved to align the second conductive pad with the first conductive pad. In some embodiments, the carrying module is movably attached to a rail. In some embodiments, the method further includes picking up the second semiconductor structure by the holding unit prior to the disposing of the carrying module over the first semiconductor structure, and releasing the second semiconductor structure from the holding unit upon or after the second semiconductor structure is in contact with the first semiconductor structure.

In some embodiments, the second semiconductor structure is released from the holding unit after the second dielectric layer is bonded with the first dielectric layer and the second conductive pad is bonded with the first conductive pad. In some embodiments, the first semiconductor structure includes an alignment pattern surrounded by the first dielectric layer. In some embodiments, the alignment pattern is disposed over the first die or disposed over a molding of the first semiconductor structure surrounding the first die. In some embodiments, a cross-section of the alignment pattern is in an annular shape, rectangular frame shape or polygonal frame shape. In some embodiments, the end portion is in contact with a predetermined position of the first dielectric layer surrounded by the alignment pattern. In some embodiments, the end portion is in contact with a predetermined position of the first dielectric layer spaced apart from the alignment pattern in a predetermined distance. In some embodiments, the first semiconductor structure includes an alignment pattern disposed within the first die and covered by the first dielectric layer. In some embodiments, the alignment pattern is a seal ring of the first die extending along a periphery of the first die, or a conductive plug vertically extending within the first die.

An aspect of this disclosure relates to a method of forming a bonded structure. The method includes providing a first semiconductor structure including a first dielectric layer and a first conductive pad surrounded by the first dielectric layer; providing a second semiconductor structure including a second dielectric layer and a second conductive pad surrounded by the second dielectric layer; providing a carrying module including a holding unit configured to hold the second semiconductor structure and an anchoring unit movably attached to the holding unit; picking up the second semiconductor structure by the holding unit; displacing the carrying module to dispose the carrying module above the first semiconductor structure and align the second semiconductor structure with the first semiconductor structure; and displacing the anchoring unit towards the first semiconductor structure to make at least a portion of the anchoring unit in contact with the first dielectric layer.

In some embodiments, the method further includes after the displacement of the anchoring unit, displacing the holding unit towards the first semiconductor structure to make second semiconductor structure in contact with the first semiconductor structure. In some embodiments, the method further includes displacing the holding unit away from the second semiconductor structure and the first semiconductor structure, and displacing the anchoring unit away from the first semiconductor structure. In some embodiments, at least the portion of the anchoring unit remains contact with the first dielectric layer during the displacement of the holding unit towards the first semiconductor structure and the displacement of the holding unit away from the second semiconductor structure and the first semiconductor structure.

An aspect of this disclosure relates to a method for forming a semiconductor structure. The method includes providing a first semiconductor structure including a first dielectric layer, a first conductive pad surrounded by the first dielectric layer and an alignment pattern at least partially exposed from the first dielectric layer; providing a second semiconductor structure including a second dielectric layer and a second conductive pad surrounded by the second dielectric layer; providing a carrying module including a holding unit configured to hold the second semiconductor structure and an anchoring unit movably attached to the holding unit, wherein the anchoring unit includes an end portion configured to be temporarily fixed on the first semiconductor structure; picking up the second semiconductor structure by the holding unit; disposing the second semiconductor structure above the first semiconductor structure; aligning the end portion with the alignment pattern; and displacing the anchoring unit towards the first semiconductor structure to make the end portion in contact with the first dielectric layer and surrounded by the alignment mark.

In some embodiments, the second conductive pad is aligned with the first conductive pad when the end portion is aligned with the alignment pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of forming a bonded structure, comprising:
providing a first semiconductor structure including a first die, a first dielectric layer and a first conductive pad electrically connected to the first die and surrounded by the first dielectric layer;

providing a second semiconductor structure including a second dielectric layer and a second conductive pad surrounded by the second dielectric layer;
providing a carrying module including a holding unit configured to hold the second semiconductor structure and an anchoring unit movably attached to the holding unit, wherein the anchoring unit includes an end portion configured to be temporarily fixed on the first semiconductor structure;
disposing the carrying module and the second semiconductor structure over the first semiconductor structure;
displacing the anchoring unit towards the first semiconductor structure to make the end portion in contact with the first dielectric layer; and
displacing the holding unit towards the first semiconductor structure to make the second semiconductor structure in contact with the first semiconductor structure.

2. The method of claim 1, wherein the displacement of the anchoring unit is performed prior to the displacement of the holding unit.

3. The method of claim 1, wherein the holding unit is displaced towards the first semiconductor structure to make the second dielectric layer in contact with the first dielectric layer and to make the second conductive pad in contact with the first conductive pad.

4. The method of claim 1, wherein the carrying module is moved to align the second conductive pad with the first conductive pad.

5. The method of claim 1, wherein the carrying module is movably attached to a rail.

6. The method of claim 1, further comprising:
picking up the second semiconductor structure by the holding unit prior to the disposing of the carrying module over the first semiconductor structure;
releasing the second semiconductor structure from the holding unit upon or after the second semiconductor structure is in contact with the first semiconductor structure.

7. The method of claim 6, wherein the second semiconductor structure is released from the holding unit after the second dielectric layer is bonded with the first dielectric layer and the second conductive pad is bonded with the first conductive pad.

8. The method of claim 1, wherein the first semiconductor structure includes an alignment pattern surrounded by the first dielectric layer.

9. The method of claim 8, wherein the alignment pattern is disposed over the first die or disposed over a molding of the first semiconductor structure surrounding the first die.

10. The method of claim 8, wherein a cross-section of the alignment pattern is in a rectangular frame shape.

11. The method of claim 8, wherein the end portion is in contact with a predetermined position of the first dielectric layer surrounded by the alignment pattern.

12. The method of claim 8, wherein the end portion is in contact with a predetermined position of the first dielectric layer spaced apart from the alignment pattern in a predetermined distance.

13. The method of claim 1, wherein the first semiconductor structure includes an alignment pattern disposed within the first die and covered by the first dielectric layer.

14. The method of claim 13, wherein the alignment pattern is a seal ring of the first die extending along a periphery of the first die, or a conductive plug vertically extending within the first die.

15. A method of forming a bonded structure, comprising:
providing a first semiconductor structure including a first dielectric layer and a first conductive pad surrounded by the first dielectric layer;
providing a second semiconductor structure including a second dielectric layer and a second conductive pad surrounded by the second dielectric layer;
providing a carrying module including a holding unit configured to hold the second semiconductor structure and an anchoring unit movably attached to the holding unit;
picking up the second semiconductor structure by the holding unit;
displacing the carrying module to dispose the carrying module above the first semiconductor structure and align the second semiconductor structure with the first semiconductor structure; and
displacing the anchoring unit towards the first semiconductor structure to make at least a portion of the anchoring unit in contact with the first dielectric layer.

16. The method of claim 15, further comprising after the displacement of the anchoring unit, displacing the holding unit towards the first semiconductor structure to make second semiconductor structure in contact with the first semiconductor structure.

17. The method of claim 16, further comprising:
displacing the holding unit away from the second semiconductor structure and the first semiconductor structure;
displacing the anchoring unit away from the first semiconductor structure.

18. The method of claim 17, wherein at least the portion of the anchoring unit remains contact with the first dielectric layer during the displacement of the holding unit towards the first semiconductor structure and the displacement of the holding unit away from the second semiconductor structure and the first semiconductor structure.

19. A method of forming a bonded structure, comprising:
providing a first semiconductor structure including a first dielectric layer, a first conductive pad surrounded by the first dielectric layer and an alignment pattern at least partially exposed from the first dielectric layer;
providing a second semiconductor structure including a second dielectric layer and a second conductive pad surrounded by the second dielectric layer;
providing a carrying module including a holding unit configured to hold the second semiconductor structure and an anchoring unit movably attached to the holding unit, wherein the anchoring unit includes an end portion configured to be temporarily fixed on the first semiconductor structure;
picking up the second semiconductor structure by the holding unit;
disposing the second semiconductor structure above the first semiconductor structure;
aligning the end portion with the alignment pattern; and
displacing the anchoring unit towards the first semiconductor structure to make the end portion in contact with the first dielectric layer and surrounded by the alignment mark.

20. The method of claim 19, wherein the second conductive pad is aligned with the first conductive pad when the end portion is aligned with the alignment pattern.

* * * * *